(12) United States Patent
Bernard et al.

(10) Patent No.: US 7,850,284 B2
(45) Date of Patent: Dec. 14, 2010

(54) METHOD FOR DRY ETCHING FLUID FEED SLOTS IN A SILICON SUBSTRATE

(75) Inventors: David L. Bernard, Lexington, KY (US); John W. Krawczyk, Richmond, KY (US); Andrew L. McNees, Lexington, KY (US)

(73) Assignee: Lexmark International, Inc., Lexington, KY (US)

( * ) Notice: Subject to any disclaimer, the term of this patent is extended or adjusted under 35 U.S.C. 154(b) by 818 days.

(21) Appl. No.: 11/779,085

(22) Filed: Jul. 17, 2007

(65) Prior Publication Data

US 2007/0257006 A1 Nov. 8, 2007

Related U.S. Application Data

(62) Division of application No. 11/170,895, filed on Jun. 30, 2005, now Pat. No. 7,271,104.

(51) Int. Cl.
*B41J 2/05* (2006.01)
(52) U.S. Cl. ............................................ 347/56; 347/65
(58) Field of Classification Search .................. 347/20, 347/56–59, 61–65, 67
See application file for complete search history.

(56) References Cited

U.S. PATENT DOCUMENTS

| | | | |
|---|---|---|---|
| 6,020,250 A | 2/2000 | Kenney | |
| 6,258,692 B1 | 7/2001 | Chu et al. | |
| 6,273,557 B1 | 8/2001 | Milligan et al. | |
| 6,345,399 B1 | 2/2002 | Jamison et al. | |
| 6,378,995 B1 | 4/2002 | Yun et al. | |
| 6,440,818 B1 | 8/2002 | Tsai et al. | |
| 6,805,432 B1 * | 10/2004 | Milligan et al. | ............... 347/65 |
| 2003/0142170 A1 | 7/2003 | Haluzak et al. | |
| 2004/0178419 A1 | 9/2004 | Song | |

OTHER PUBLICATIONS

Chen et al. "IEEE Transaction on Electron Devices," vol. 4, No. 9 (Sep. 1997), pp. 1401-1409.
Senna et al. "The 8th International Conference on Solid-State Sensors and Actuators," Jun. 25-29, 1995, pp. 194-197.
S. Wolf and R.N. Tauber, "Silicon Processing for the VLSI Era, vol. 1—Process Technology," Lattice Press, 1986, p. 539.

* cited by examiner

*Primary Examiner*—Juanita D Stephens

(57) ABSTRACT

A method of micro-machining a semiconductor substrate to form one or more through slots therein. The semiconductor substrate has a device side and a fluid side opposite the device side. The method includes diffusing a p-type doping material into the device side of the semiconductor substrate in one or more through slot locations to be etched through a thickness of the substrates. The semiconductor substrate is then etched with a dry etch process from the device side of the substrate to the fluid side of the substrate so that one or more through slots having a reentrant profile are formed in the substrate.

12 Claims, 7 Drawing Sheets

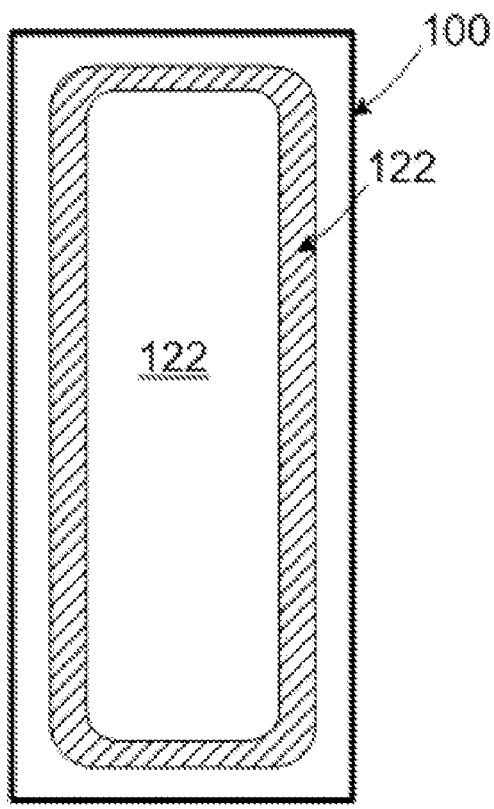
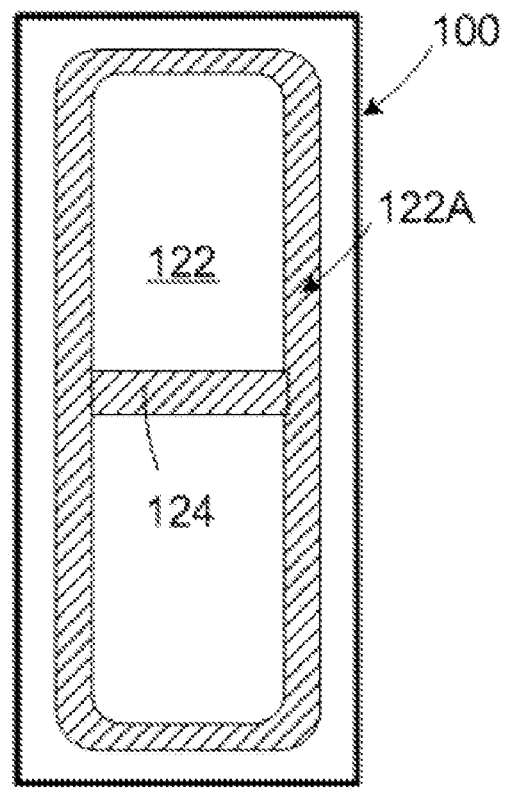
FIG. 14
FIG. 15

METHOD FOR DRY ETCHING FLUID FEED SLOTS IN A SILICON SUBSTRATE

RELATED APPLICATION

This application is a division of application Ser. No. 11/170,895, filed Jun. 30, 2005, now issued U.S. Pat. No. 7,271,104.

FIELD OF THE DISCLOSURE

The disclosure relates micro-fluid ejection heads and, in particular, to micro-fluid ejection heads containing fluid feed slots and methods of dry etching the fluid feed slots in a silicon substrate for micro-fluid ejection heads.

BACKGROUND AND SUMMARY

With the advent of a deep reactive ion etching (DRIE) process for forming slots and trenches in a semiconductor substrate, greater precision and control over the etching of silicon substrates in higher speed processes has been obtained. DRIE is a dry etching process carried out under high vacuum by means of a chemically reactive plasma, wherein the constituents of the plasma are selected in congruence with the substrate to be acted upon. Before the adoption of DRIE techniques to form trenches or slots in semiconductor substrates, most trenches or slots in substrates greater than about 200 microns thick were formed by mechanical blasting techniques or chemical wet etching techniques. However, such mechanical techniques or chemical wet etching techniques are not suitable for newer products that demand higher tolerances and smaller fluid flow features. DRIE enables deep anisotropic etching of trenches and slots with greater tolerances and without regard to crystal orientation.

DRIE techniques have progressed incrementally towards a goal of etching high aspect ratio features in semiconductor substrates wherein the aspect ratio is on the order of 1:100 width to depth. The process scheme for achieving high aspect ratio slots or trenches in semiconductor substrates includes a series of sequential steps of alternating etching and passivation. Such aniosotropic etching techniques are described in U.S. Pat. Nos. 5,611,888 and 5,626,716 to Bosch et al. the disclosures of which are incorporated herein by reference.

Most dry etching systems are designed to etch substantially vertical wall slots and trenches in the substrate, i.e., walls that are substantially perpendicular to a surface of the substrate. However, for micro-fluid ejection heads, it has been found that substantially vertical walls may entrap more air in fluids passing through relatively narrow slots. Such air entrapment can lead to fluid starvation for ejection devices on a device surface of the substrate. Accordingly, slots having reentrant wall angles are preferred. However, etching slots having reentrant wall angles increases the occurrence of etching defects in the substrate.

In order to prevent etching in areas adjacent to the areas to be etched, an etch mask is applied to a device surface of the substrate. Occasionally defects occur at or near the surface of the substrate adjacent to the etching location. Such defects may enable etching radicals to diffuse into a gap between the substrate surface and the etch mask applied to the substrate surface causing damage to the substrate surface on the device side of the substrate, hereinafter referred to as "device side damage." Device side damage may also be caused by complete removal of a passivating layer along side walls in the slot location during the etching process. FIG. 1 is a photomicrograph of a portion of a device side of a semiconductor substrate 10 containing device side damage 12 adjacent to a fluid flow slot 14 therein. Despite advances made in the formation of slots and trenches in semiconductor substrates using a dry etch process alone, there continues to be a need for an improved process which provides desired slot wall angles while reducing the occurrence of device side damage to the semiconductor substrate.

With regard to the foregoing, there is provided a method of micro-machining a semiconductor substrate to form one or more through slots therein. The semiconductor substrate has a device side and a fluid side opposite die device side. The method includes diffusing a p-type doping material into the device side of the semiconductor substrate in one or more through slot locations to be etched through a thickness of the substrate. The semiconductor substrate is then etched with a dry etch process from the device side of the substrate to the fluid side of the substrate so that one or more through slots having a reentrant profile are formed in the substrate.

In another embodiment there is provided a process for etching a semiconductor substrate from a device side thereof to a fluid side thereof using a dry etch process to form at least one reentrant fluid flow slot therein. The process includes doping a portion of the device side of the substrate with a p-type doping material whereby device side silicon damage adjacent at least one fluid flow slot is effectively reduced.

An advantage of the process disclosed herein is that the process is capable of providing precisely formed slots having a reentrant profile while reducing the occurrence of device side damage to the substrate.

BRIEF DESCRIPTION OF THE DRAWINGS

Further advantages of the embodiments will become apparent by reference to the detailed description of preferred embodiments when considered in conjunction with the drawings, wherein like reference characters designate like or similar elements throughout the several drawings as follows:

FIGS. 14 and 15 are plan views, not to scale, of portions of semiconductor substrates containing p-doped areas according to alternate embodiments of the disclosure.

DETAILED DESCRIPTION OF PREFERRED EMBODIMENTS

Figure 2:
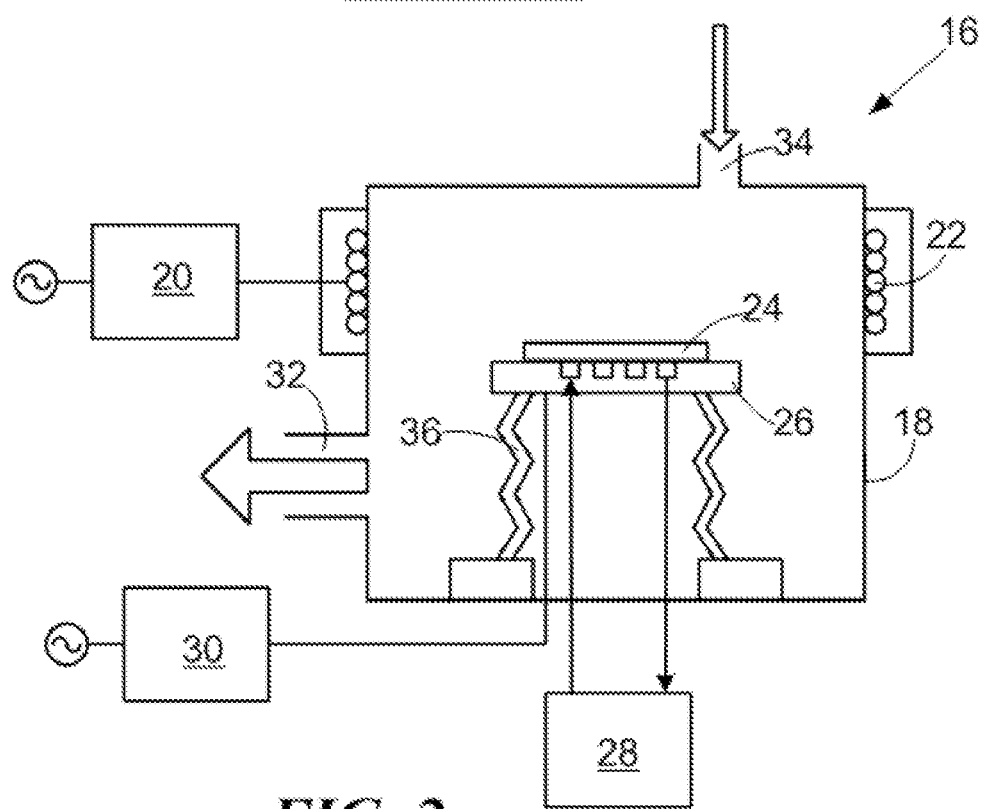
FIG. 2 is schematic diagram of a deep reactive ion etching system.
Figure 3:
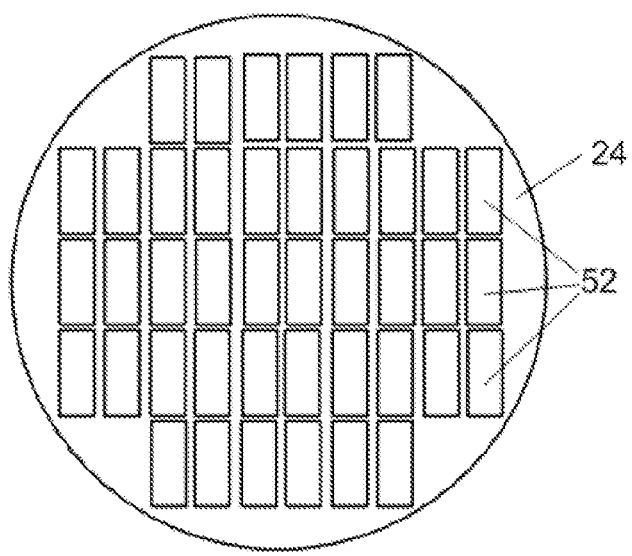
FIG. 3 is a plan view, not to scale, of a wafer containing a plurality of semiconductor substrates.

A schematic diagram of a typical DRIE system 16, in this instance an inductively coupled plasma (ICP) system, used for dry etching slots or holes (hereinafter collectively referred to as "slots") in a semiconductor silicon substrate is illustrated in FIG. 2. The system 16 includes a ceramic reaction chamber 18 and a radio frequency (rf) unit 20 for providing source power to a coil 22 to generate a plasma in the reaction chamber 18. A wafer 24 containing a plurality of semiconductor substrates 52 (FIG. 3) is disposed in the chamber 18 on a temperature controlled platen 26. The temperature of the platen 26 and thus the wafer 24 is controlled by a temperature control unit 28 providing helium gas to the platen 26. A platen power unit 30 provides rf biasing power to the platen 26 during the etching process. The chamber 18 is maintained at a negative pressure, with respect to atmospheric pressure, during etching by a vacuum pumping unit coupled to a vacuum port 32. A reactive gas is introduced into the chamber through a gas inlet port 34. A bellows system 36 may be provided to adjust a height of the platen 26 during the etching process.

The system 16 provides electromagnetic energy to gaseous species within the chamber 18 by applying power to the rf coil 22 wrapped around a dielectric portion of the chamber 18. As current oscillates in the coil 22 very little power dissipation is realized prior to plasma ignition resulting in an ever increasing floating potential difference across the coil 22. The potential difference across the coil 22 provides capacitive coupling of the coil 22 to the dielectric portion of the chamber 18 resulting in an electric field. Eventually the floating potential difference reaches a threshold limit. At the threshold limit, voltage breakdown occurs rendering an ionic mixture including radicals, electrons and emitted photons from a previously neutral gas. The ionic mixture is a luminescent ionized gas generally called a plasma.

Any gas, under the right conditions will form a plasma. However gases used in etching or deposition are chosen strategically to affect particular substrates in a prescribed manner. For example, silicon etching is primarily accomplished in the presence of fluorine or fluorine evolving gases such as sulfur hexafluoride ($SF_6$). Sulfur hexafluoride undergoes ionization according to the following reaction:

$$SF_6 + e^- \rightarrow S_xF_y^+ + S_xF_y^* + F^* + e^- \quad (1)$$

thereby producing the reactive fluorine radicals which react with silicon according to the following reaction:

$$Si + F^* \rightarrow SiF_x \quad (2)$$

to produce a volatile gas. A reaction of the fluorine radicals with silicon isotropically etches the silicon.

Figure 4A:
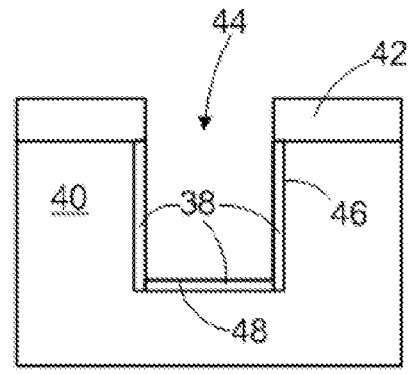
FIGS. 4A-4C are schematic diagrams of a prior art dry etching process for a slot in a semiconductor substrate.
Figure 4B:
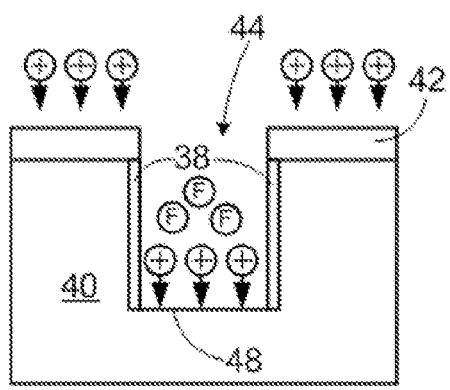
Figure 4C:
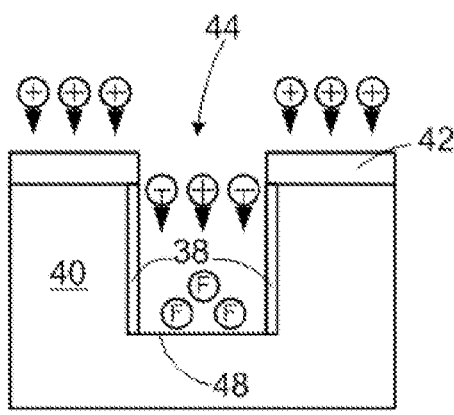

Isotropic etching, however, is geometrically limited. To produce high aspect ratio features in a silicon substrate with predominantly vertical walls a directional or anisotropic etch is used. In order to produce vertical walls with high aspect ratios, a deep reactive ion etching (DRIE) process is used. The DRIE process includes alternating etching and passivating cycles as shown in FIGS. 4A-4C wherein a fluorocarbon polymer ($nCF_2$) is generated to provide a passivating layer 38 during the passivating cycles of the process. Cycling times for each step preferably range from about five to about twenty seconds. The fluorocarbon polymer is derived from a compound such as octofluorobutane ($C_4F_8$) according to the following reactions:

$$C_4F_8 + e^- \rightarrow CF_x^* + CF_x^* + F^* + e^- CF_x^* \rightarrow nCF_2 \quad (3)$$

Prior to etching a semiconductor substrate 40, a mask 42 (FIGS. 4A-4C) is applied to the substrate 40 to provide a location for fluid flow slots 44 in the substrate 40. A dry etching process for etching the silicon substrate 40 to form the fluid flow slots 44 therein is described in U.S. Pat. No. 6,402,301 to Powers et al., the disclosure of which is incorporated herein by reference.

During a passivating step of the process, a $C_4F_8$ gas is introduce into the chamber 18 and a plasma is generated under conditions that enable the fluorocarbon polymer to condense on exposed surfaces of the substrate 40 including on side wall surfaces 46 and bottom surface 48 to provide the passivation layer 38 (FIG. 4A). Immediately following the passivating step, the $C_4F_8$ is evacuated from the chamber 18 and replaced with a reactive etching gas $SF_6$ that forms a reactive plasma under the influence of new, and often radically, different operating conditions (FIG. 4B). As a rule of thumb, for instance, little or no power is applied to the platen 26 during the passivating step as the general intent during this step is to promote condensation of to the fluorocarbon polymer uniformly on the side wall surfaces 46 and bottom surface 48 of the substrate 40. Increasing the platen power reduces condensation of the fluorocarbon polymer on the bottom surface 48 of the substrate 40.

During the etching step the platen power is increased to promote removal of passivation species from the bottom surface 48 of the forming slot 44. Ions or charged species are influenced by electromagnetic fields with their trajectories tangentially directed along field lines. Because the pertinent field lines are substantially perpendicular to the bottom surface 48 of the developing slots 44, and because passivation removal is generally a line of sight phenomena with areas perpendicular to the side wall surfaces 46 receiving a disproportionate share of the ionic bombardment, passivation is removed from the bottom surface 48 of the slot 44 at a much higher rate than from the side wall surfaces 46. As a result, the etching rate of the bottom surface 48 is significantly higher than the passivated side walls surfaces 46.

While fluorocarbon polymerization during passivation and disproportionate ionic bombardment at the bottom surface 48 of the slot 44 result in etch directionality, it is the fluorine radical that is responsible for the actual etching of the substrate 40 (FIG. 4C). Radicals species are naturally evolved in plasma chemistries produced in accordance with equation (1) and, in contrast to ions, are unaffected by electromagnetic fields with their propagation to the substrate surface 48 driven purely by diffusion. Upon arriving at a bare surface 48 not protected by passivation, radicals spontaneously etch silicon according to equation (2). Therefore etch directionality is a consequence of strategically incomplete passivation removal. Complete removal of the passivating layer 38 from the side wall surfaces 46 may promote device side damage of the substrate 40 as illustrated by device side damage 12 in FIG. 1.

Figure 5:
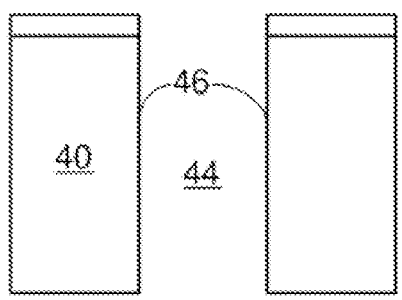
FIG. 5 is a cross-sectional view, not to scale, of a slot made in a substrate by a prior art dry etching process.

It will be appreciated that the result of each etching cycle is an isotropic etch of the substrate 40. However, since the cycle time between the etching and passivating steps is kept relatively short, the resulting fluid flow slot 44 has substantially vertical side wall surfaces 46 as illustrated by the substrate 40 in FIG. 5. Generally, the smaller the etch step to passivation step ratio and the shorter the overall individual process step cycle time the more vertical will be the side wall surfaces 46 of the slot 44. However, this is an over-simplification of a very complex process. In actuality the geometry of slot 44 is a function of numerous parameters many of which vary non-linearly.

For example, etching may be conducted by setting values for the rf source power during etch, the rf source power during passivation, the rf platen power, often referred to as bias power, during etch, the rf platen power during passivation, gas flow rate, chamber pressure, etch to passivation time, cycle time, pressure during etch, pressure during passivation, platen temperature, electromagnetic current, z-height of the platen, and the like. Some or all of the above parameters may be ramped up or down simultaneously during the etching cycles. From this broad choice of operating parameters a multitude of plasmas with markedly different characteristics may be generated producing different geometries of the side wall surfaces 46 of the substrate 40.

However, etching reentrant slots 50 (FIG. 6) in a semiconductor substrate 52 with tools designed to produce non-vertical side wall surfaces 54 becomes problematic in a situation where device side 56 dimensions and tolerances are rigidly set parameters that are necessary for proper device functionality. Etching from the device side 56 of the substrate 52 is conducted in order to precisely place the slot 50 in the substrate 52. However, as described above, device side 56 damage is more likely to occur when etching reentrant slots 50 as opposed to the vertical side wall slots 44 (FIG. 5) due to the difficulty in controlling the various etching and passivating parameters described above.

As set forth above, conventional DRIE etch systems 16 are typically designed to produce trenches or slots 44 having vertical side wall surfaces 46. However, for micro-fluid ejection head applications, vertical side wall surfaces 46 are less desirable for air bubble mobility through the slots 44. There is evidence that substantially vertical fluid slots 44 may cause inadequate fluid flow to ejection devices on a device side of the substrate 40.

Figure 7:
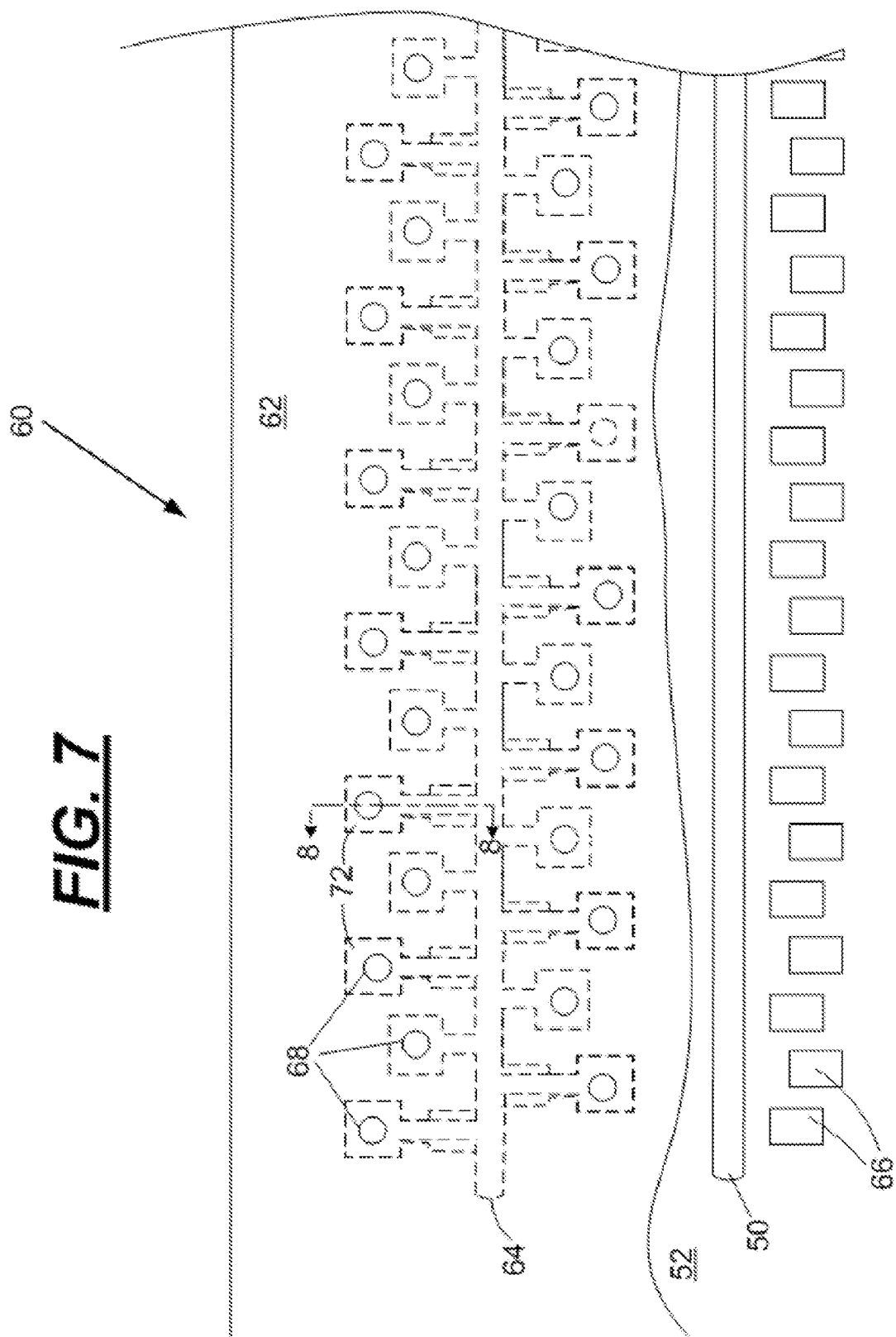
FIG. 7 is a plan view, not to scale, of a portion of a micro-fluid ejection head.

A plan view of a portion of a micro-fluid ejection head 60 and device side of the substrate 52 is illustrated in FIG. 7. The ejection head 60 includes the substrate 52 and a nozzle plate 62 attached to the substrate. The substrate 52 may include a single fluid flow slot 50 or multiple fluid flow slots 50 and 64. A plurality of ejection devices, such as devices 66 are adjacent the slots 50 and 64. Upon activation of the ejection devices 66, fluid is ejected through the nozzle holes 68 in the nozzle plate 62.

Figure 8:
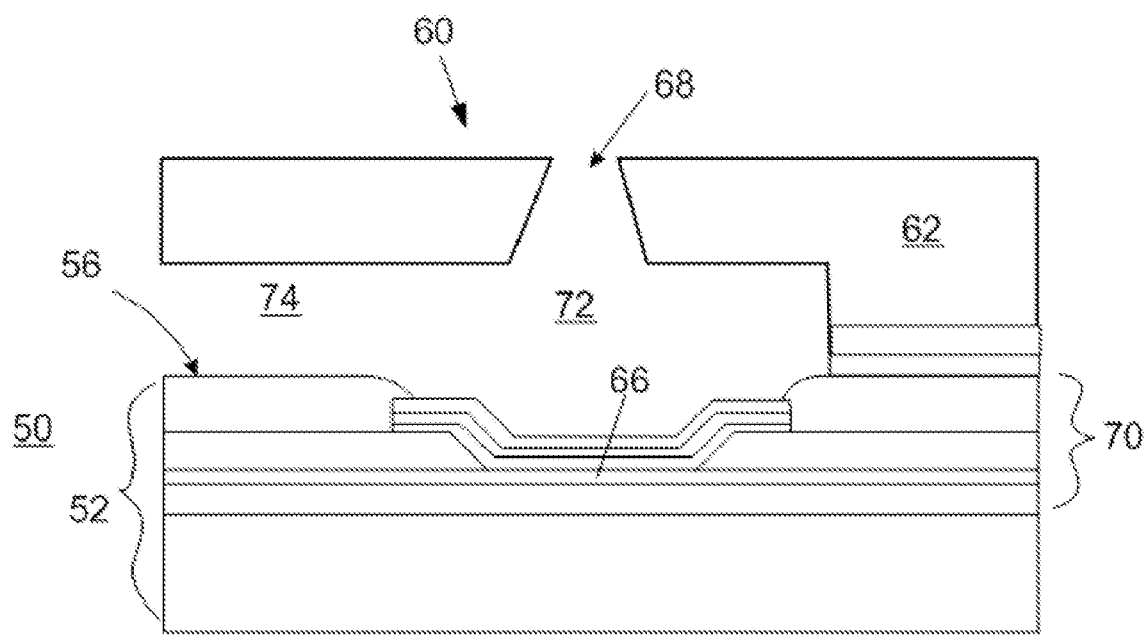
FIG. 8 is a cross-sectional view, not to scale, of a portion of the micro-fluid ejection head of FIG. 7.

A cross-sectional view, not to scale, of a portion of the micro-fluid ejection head 60 is illustrated in FIG. 8. The substrate 52 includes a plurality of layers 70 on the device side 56 thereof defining the plurality of ejection devices 66 and passivation and insulating layers. The nozzle plate 62 includes the nozzle holes 68, a fluid chamber 72 and a fluid channel 74, collectively referred to as flow features, in fluid flow communication with the slot 64 for providing fluid to the ejection devices 66. As the size of flow features in the micro-fluid ejection heads decreases, and the frequency of fluid ejection increases, adequate fluid supply to the ejection devices 66 becomes more critical. In order to assure adequate fluid is provided to the ejection devices 66, it is desirable to provide slots 50 having the reentrant profiles for the reasons described above.

Of the operating parameters that can be controlled during a DRIE process, the most influential for controlling slot profile appear to be chamber pressure, platen and source powers, platen temperature, distance between the substrate and the plasma source, and the etch to passivation cycle ratio. However, various combinations of some or all of the foregoing parameters have proved to be severely detrimental to overall cycle times, mask selectivity, mask removal post etch, device side 56 damage, or a combination thereof. For example, moving the wafer 24 closer to the plasma power source coils 22 significantly reduces die silicon etch selectivity with respect to the etch mask, unacceptably increases the cycle time as much as two-fold, and reduces mask removal efficiency. Likewise, a substrate temperature increase also negatively impacts the overall DRIE process in a similar manner with particularly egregious effects on mask removal. Significant increases in etch to passivation ratio beyond certain limits produce device side 56 damage and reduce an ability to control the width or location of the slot 50.

With respect to an ability to dry etch reentrant fluid flow slots 50 in the substrate 52, the most influential parameters appear to be chamber pressure and platen power. For a DRIE system 16, it is preferred to control the platen power and chamber pressure independently for each of the etching and passivating steps of the process.

By way of further background, process schemes designed to maximize the etch rate for vertical walls typically use etch pressures and platen powers during the etching steps that are significantly higher than the pressure and powers during the passivating steps of the process. For example, the substrates 40 with vertical side wall surfaces 46 having the slots 44 (FIG. 5) etched therein at rates in excess of 12-15 microns per minute (with critical dimensions of few hundred microns in width and ten or so millimeters in length) may use chamber pressures of about 150 milliTorr and platen powers of about 200 Watts for the etching steps of the process, and may use chamber pressures of about 25 milliTorr and platen powers of about 0.0 Watts for the passivating steps.

In order to produce the slots 50 having the more desirable reentrant profiles, variations of three to five of the key operational parameters are selected. Particularly, variations are made in the source power, platen power, chamber pressure, etch to passivating cycle ratio, and platen temperature in order to provide the reentrant fluid feed slots 50.

Figure 6:
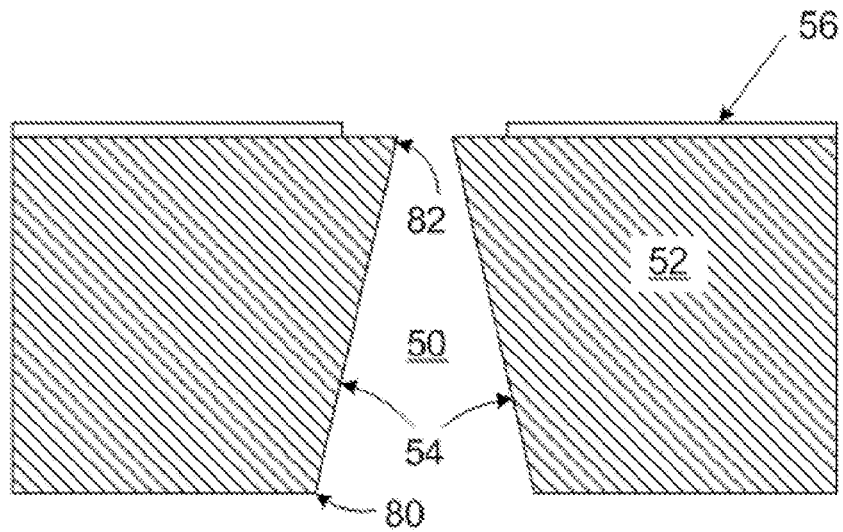
FIG. 6 is a cross-sectional view, not to scale, of a substrate containing a reentrant slot made by a dry etching process.

Reentrancy in a DRIE process is a function of ion trajectory. Reentrancy occurs when a bottom portion 80 of the developing slot 50 is etched at a faster rate than an upper portion 82 of the slot 50 (FIG. 6). Disproportionate etching of the slot 50 is accomplished primarily by increasing the kinetic energy of ions bombarding the substrate 52 near the bottom portion 80 of the slot 50. An efficient way to increase ion impact energy is by increasing the platen power in relation to the source power for the plasma. As the platen power is increased and the source power is decreased, the ion velocity and hence the kinetic energy of ions bombarding the bottom portion 80 of the slot 50 is increased.

Another factor effecting ion energy is a combination of decreasing etch pressure and a reduction of source power as the etch process progresses. However, reducing the source power and decreasing the pressure in the chamber during the etch cycle is counter to conventional wisdom on how to achieve reentrant profiles.

Lowering the pressure and power simultaneously reduces the number of inelastic energy exchanges leading to a reduction in ionization, disassociation, etc. Nevertheless, fewer ionized species due to the decrease in source power and fewer species overall due to the decrease in pressure result in an increased combination of plasma constituent kinetic energy and mean free path between the ionized species. The "mean free path" is an average distance a species travels between collisions. As the density (pressure) of the etching gas is reduced, the mean free path between ionized species is increased. When the mean free path is large, atoms (molecules, sub-atomic species) can achieve significantly larger velocities. Furthermore, because the energy required to ionize a species is quantitized with a threshold below which ionization does not occur, and additions to kinetic energy occur within a continuum, energy of motion can accumulate and increase over numerous etching cycles when ionization occurs at a reduced rate.

In addition to selecting plasma parameters to increase and modify ion trajectories, two other factors affecting reentrancy profiles are platen or substrate temperature and etch step to passivation step ratio. The passivating step of the process is highly sensitive to the substrate temperature. Higher temperatures inhibit deposition of the fluorocarbon polymer on the side wall surfaces 54 (FIG. 6) and thus result in an etch profile with lower anisotropy and greater reentrancy profile. Accordingly, increasing the platen temperature from about −19° C. to about 20° C. increases the reentrancy profile of the slot 50.

Also, the greater the etch step to passivation step ratio the greater the anisotropy of the etching process. However, there is little to room to increase the etch to passivation ratio while maintaining an acceptable minimum of device side damage. A typical etch step to passivation step ratio is about 7:3.

It is possible to produce the slots 50 having reentrant profiles without ramping up or down the various parameters described above. However, providing parameters which are selected at the outset and remain constant throughout the etching process may have negative effects on the overall etching process or resulting product. For example, processes with a lower constant etch pressure will tend to produce reentrant profiles at a lower etch rate and hence greater cycle time. On the other hand, if the pressure is initially high and is ramped down throughout the process, the negative effects on etch rate may be counteracted. While providing pressures that enhance the reentrant profile as the depth of the etch progresses through the substrate 52.

Likewise, a high platen power, while tending to produce reentrant profiles at a constant rate, lowers to a great extent the etch selectivity between the substrate 52 and the etch mask. By choosing an initially lower platen power and ramping the power up throughout the process the detrimental effects of etch selectivity can be reduced without sacrificing the benefits achieved by proving a higher platen power as the etch depth of the slot 50 through the substrate 52 progresses.

Accordingly, the source power according to the embodiments described herein may be ramped down beginning in a range of 2500 to about 3000 Watts to a range of from about 1500 to about 2000 Watts during the etching process. The chamber pressure may be decreased from an initial pressure ranging from about 100 to about 150 milliTorr to a pressure ranging from about 30 to about 60 millitorr during the process. The platen power may be increased from an initial power ranging from about 150 to about 200 Watts to a power in the range of from about 200 to about 300 Watts.

When dry etching semiconductor materials using a DRIB process, characteristic feature dimensions are of significant functional importance. The formation of one desirable feature may be detrimental to the formation of another feature that is equally desirable. In many situations optimizing two such features results in the unfortunate dilemma whereby the process parameters to achieve the first desirable feature are opposite to the parameters used to achieve the second desirable feature.

Figure 1:
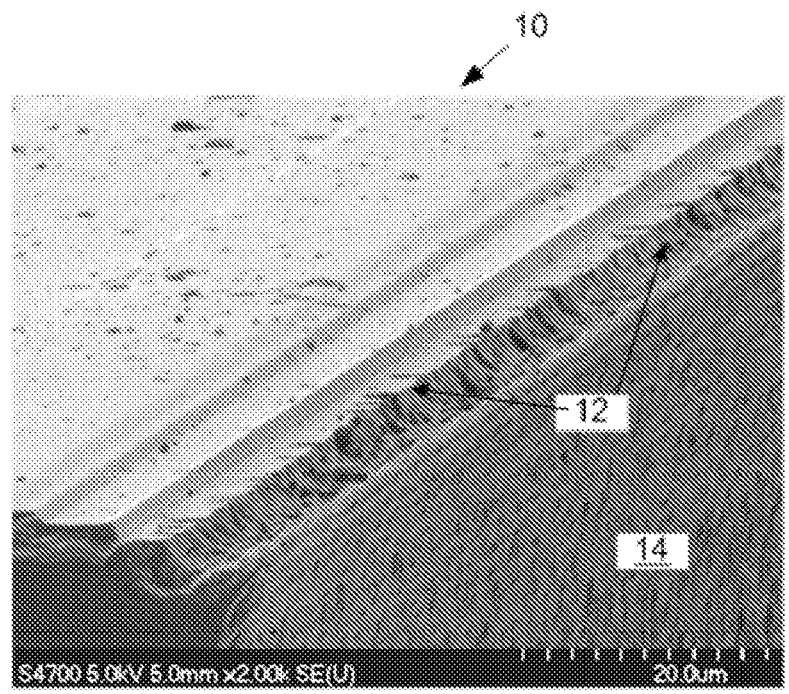
FIG. 1 is a photomicrograph perspective view of a portion of a device side of a prior art semiconductor substrate containing a dry-etch formed slot therein.

For example, there is an inverse relationship between the reentrant profile of the slot 50 formed in the substrate 52 and the amount of device side damage 12 (FIG. 1). Reentrant slot profiles are desirable for improving fluid flow and delivery of fluid to the device side 56 of the substrate 52. Device side damage negatively affects shelf length control which may lead to cross talk between fluid chambers 72 (FIG. 8), low chip strength and performance variability. Plasma process parameters selected to achieve the desirable reentrant profiles often increase the device side damage 12. Small variations in the parameters of the etching process have significant impact on the device side damage 12.

Furthermore, as the etching process through the substrate 52 progresses, the process parameters selected to provide the reentrant slot profiles also increase etch mask "erosion" rates. The longer the etch cycle, the greater the likelihood of increased device side damage 12 to the substrate 52.

Figure 9:
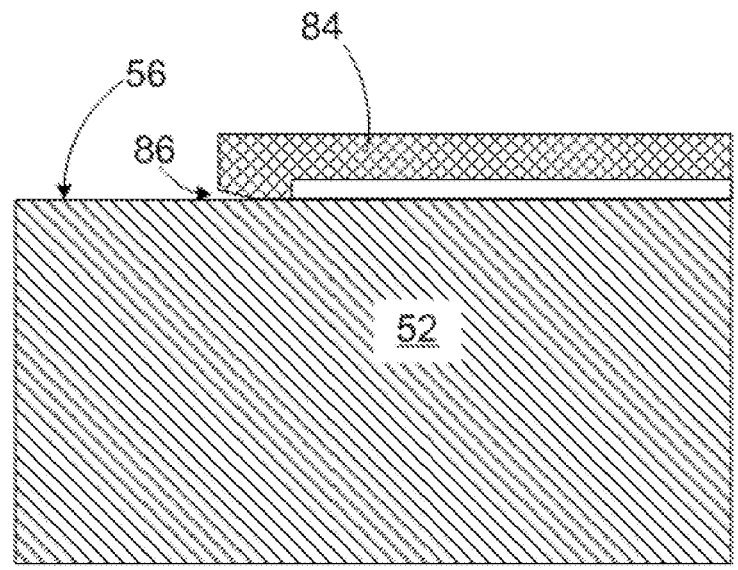
FIG. 9 is a partial cross-sectional view of a semiconductor substrate containing a mask layer.

Device side damage 12 may also be caused by partial lifting of the mask layer 84 from the device side 56 of the substrate 52 forming a gap 86 as shown in FIG. 9. Such gap 86 between the device side 56 and mask layer 84 may provide a location for plasma etching of the substrate 52 thereby causing device side damage 12.

Figure 12:
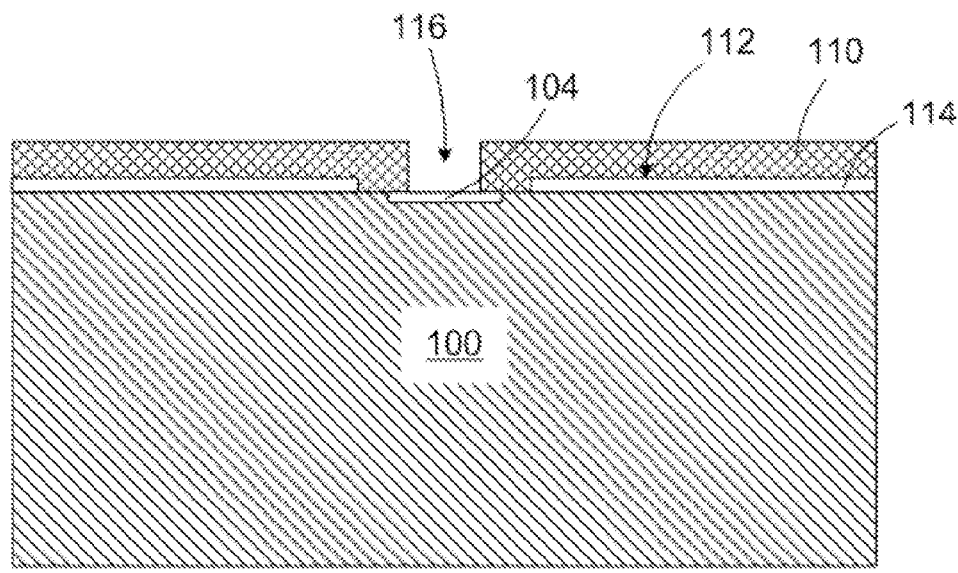
FIG. 12 is a cross-sectional view, not to scale, of a portion of a semiconductor substrate containing a mask developed to provide a slot etching location in the substrate.

In order to reduce the device side damage 12 to a semiconductor substrate 100 resulting from etch parameter selection or mask lifting. When forming slots 102, indicated by broken lines in FIG. 10, with reentrant wall angles, a p-type doping material 104 is diffused into the substrate 100 in a slot location 116 (FIG. 12) prior to etching the reentrant slot 102 in the substrate 100. The concentration of p-type doping material 104 diffused into the substrate 100 is preferably greater than about $1\times10^{19}$ per $cm^3$. A suitable depth of the p-type doping material 104 diffusion into the substrate 100 may range from about 0.5 to about 9 microns. However, from about 1 to about 2 microns depth of p-type doping material 104 at a concentration of about $5\times10^{19}$ per $cm^3$ may be effective to reduce device side damage to the substrate 100. A preferred doped area 108 includes the slot 102 and an area that is from about 15 to about 20 microns larger than the slot 102 and that substantially circumscribes the slot 102.

Figure 10:
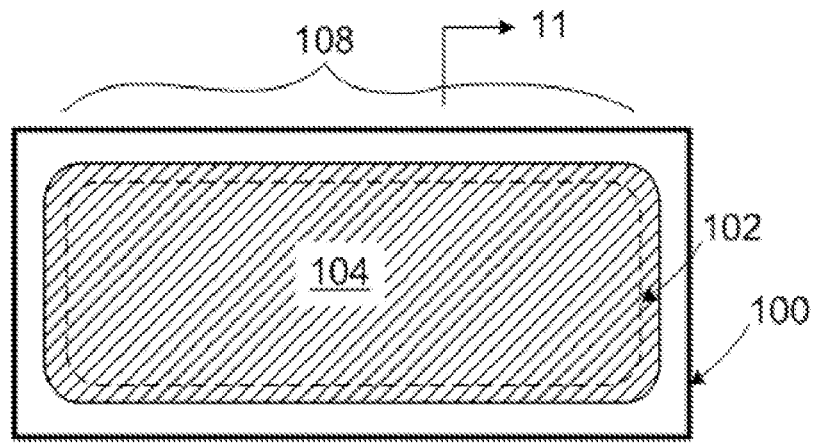
FIG. 10 is a plan view, not to scale, of a portion of a semiconductor substrate containing a p-doped area according to one embodiment of the disclosure.
Figure 11:
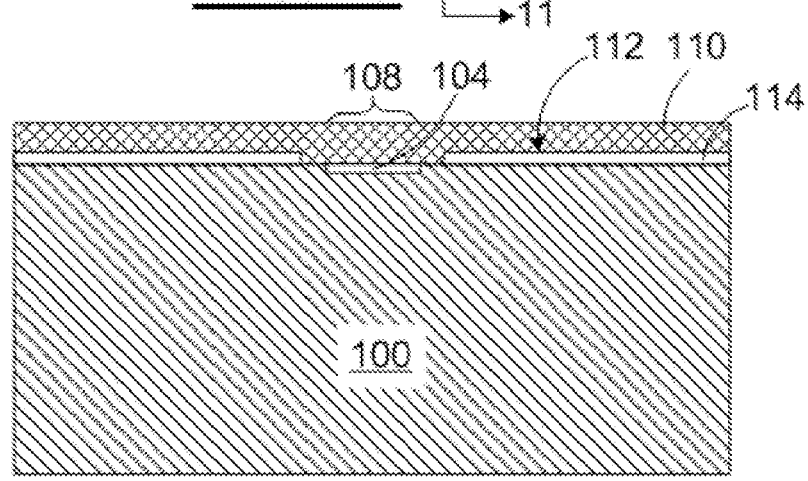
FIG. 11 is a cross-sectional view of the semiconductor substrate of FIG. 10 taken along view 11-11.

A suitable material for p-doping of the substrate 100 is the Group III element boron. A diborane source may be used to dope the silicon substrate 100 to provide the doped area 108 as shown in FIGS. 10 and 11.

Figure 13:
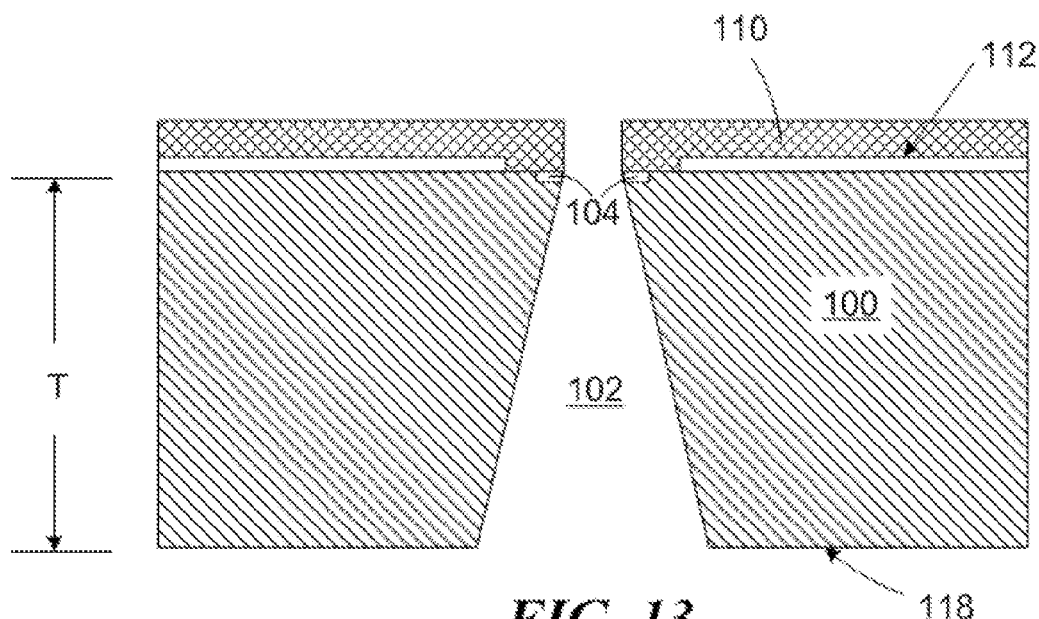
FIG. 13 is a cross-sectional view, not to scale, a semiconductor substrate containing a reentrant slot made according to an embodiment of the disclosure.

Next, a photoresist mask layer 110 is applied to a device surface 112 of the substrate 100 over the doped area 108 and over a planarization layer 114. The photoresist mask layer 110 is etched and developed to provide an exposed area 116 of the substrate 100. Dry etching of the substrate 100 is then conducted as described to above to provide fluid flow slots 102 having reentrant wall angles through the thickness T of the substrate 100 from a device side 112 to a fluid contact side 118 as shown in FIG. 13.

Without desiring to be bound by theoretical considerations, it is believed that doping the substrate 100 with a p-type doping material 104 in the aforementioned concentration is effective to change the etch rate of the doped portion 108 of the substrate 100 relative to the non-doped portion of the substrate 100 so that a horizontal etch rate of the substrate adjacent to the slot 102 is significantly decreased thereby decreasing the device side damage 12. One theory for the difference in etch rates is that interstitial bonds between silicon and the p-type doping material require more energy to break than silicon to silicon bonds.

In other embodiments, different shaped doped areas may be provided as shown in FIGS. 14 and 15. In FIG. 14 the doped area is in the shape of a race-track 120 substantially circumscribing a slot location 122. In FIG. 15, the doped area includes a race-track 122A and an area 124 bisecting the race trace as shown. The area 124 bisecting the race trace 122A may provide an unetched region of the substrate 100 that may be useful for providing support to the nozzle plate 62 described above.

Subsequent to etching the substrate to form the slot 102, the masking material 110 is removed from the device side of the substrate to provide the structure as shown in FIG. 6.

It is contemplated, and will be apparent to those skilled in the art from the preceding description and the accompanying drawings, that modifications and changes may be made in the embodiments of the disclosure. Accordingly, it is expressly intended that the foregoing description and the accompanying drawings are illustrative of preferred embodiments only, not limiting thereto, and that the true spirit and scope of the present disclosure be determined by reference to the appended claims.

What is claimed is:

1. A micro-machined semiconductor substrate having a device side and a fluid side opposite the device side, and having one or more reentrant through slots formed therein from the device side to the fluid side by a dry etching process, the substrate comprising:

a p-type doping material diffused into the device side of the semiconductor substrate adjacent to the one or more through slot, wherein the p-type doping material is effective to provide the substrate with a device side that is substantially devoid of device side damage adjacent the one or more through slots.

2. A micro-fluid ejection head containing the substrate of claim 1.

3. The substrate of claim 1 wherein the p-type doping material comprises boron from a diborane source.

4. The substrate of claim 1, wherein the p-type doping material is diffused into the substrate in a pattern substantially circumscribing each of the one or more through slot locations to provide a race-track pattern of the doping material adjacent to the one or more through slot locations.

5. The substrate of claim 1, wherein the p-type doping material is diffused into the substrate to provide a concentration of p-type doping material of greater than about $1\times10^{19}$ per $cm^3$ in the substrate.

6. The substrate of claim 1, wherein the p-type doping material has a diffusion depth in the substrate ranging from about 0.5 to about 9 microns.

7. A semiconductor substrate having a device side, a fluid supply side, and a fluid flow slot location, the substrate comprising at least one reentrant fluid flow slot deep reactive ion etched through the substrate from the device side to the fluid supply side in the fluid flow slot location wherein the fluid flow slot location comprises a p-type doping material, and wherein the substrate has a reduced amount of device side silicon damage adjacent the flow slot.

8. A micro-fluid ejection had containing the substrate of claim 7.

9. The substrate of claim 7, wherein the p-type doping material comprises boron from a diborane source.

10. The substrate of claim 7, wherein the p-type doping material is diffused into the substrate in a pattern substantially circumscribing the fluid flow slot location to provide a race-track pattern of the doping material adjacent to the fluid flow slot location.

11. The substrate of claim 7, wherein the p-type doping material is diffused into the substrate to provide a concentration of p-type doping material of greater than about 1×1019 per cm3 in the substrate.

12. The substrate of claim 7, wherein the p-type doping material has a diffusion depth in the substrate ranging from about 0.5 to about 9 microns.

* * * * *